United States Patent
Wu

(10) Patent No.: US 6,439,244 B1
(45) Date of Patent: Aug. 27, 2002

(54) PEDESTAL DESIGN FOR A SPUTTER CLEAN CHAMBER TO IMPROVE ALUMINUM GAP FILLING ABILITY

(75) Inventor: Hsiao-Che Wu, Taoyuan (TW)

(73) Assignee: ProMos Technologies, Inc., Hsin-Chu (TW)

( * ) Notice: Subject to any disclaimer, the term of this patent is extended or adjusted under 35 U.S.C. 154(b) by 65 days.

(21) Appl. No.: 09/689,929

(22) Filed: Oct. 13, 2000

(51) Int. Cl.[7] ............................. B08B 6/00; C23F 1/00; C23C 14/34
(52) U.S. Cl. ............. 134/1.1; 204/192.12; 204/298.31; 204/298.09; 204/248.15
(58) Field of Search ................... 204/192.32, 298.31, 204/298.09, 298.15; 134/1.1

(56) References Cited

U.S. PATENT DOCUMENTS

| | | | |
|---|---|---|---|
| 4,620,081 A | * 10/1986 | Zeren | 219/121 EE |
| 4,842,683 A | * 6/1989 | Cheng et al. | 156/345 |
| 5,391,275 A | * 2/1995 | Mintz | 204/192.32 |
| 5,817,577 A | * 10/1998 | Ko | 438/694 |
| 6,033,482 A | 3/2000 | Parkhe | 118/728 |
| 6,077,353 A | 6/2000 | Al-Sharif et al. | 118/500 |
| 6,077,404 A | 6/2000 | Wang et al. | 204/192.15 |
| 6,081,414 A | 6/2000 | Flanigan et al. | 361/234 |
| 6,090,246 A | 7/2000 | Leiphart | 204/192.13 |

OTHER PUBLICATIONS

Chapman, B., "Glow Discharge Processes Sputtering and Plasma Etching", pp. 253–255 (1980).*

* cited by examiner

Primary Examiner—Steven H. VerSteeg
(74) Attorney, Agent, or Firm—George O. Saile; Stephen B. Ackerman; Larry J. Prescott

(57) ABSTRACT

A sputter cleaning system and method are described which provide improved temperature control of the pedestal and thus of a substrate being sputter cleaned. The sputter cleaning system comprises a conducting metal pedestal to provide a conducting surface beneath a substrate being sputter processed. A cooling channel is formed in the metal pedestal. In one example the cooling channel typically is made up of a number of concentric, interconnected, circular cooling sub-channels. Other shape cooling channels, such as radial, can also be used. An inlet tube delivers a cooling liquid, such as water, to the cooling channel and an exhaust tube removes the cooling liquid from the cooling channel thereby removing heat from the pedestal. The cooling liquid removes heat from the pedestal, thereby controlling the temperature of the pedestal and the substrate undergoing sputter cleaning.

21 Claims, 4 Drawing Sheets

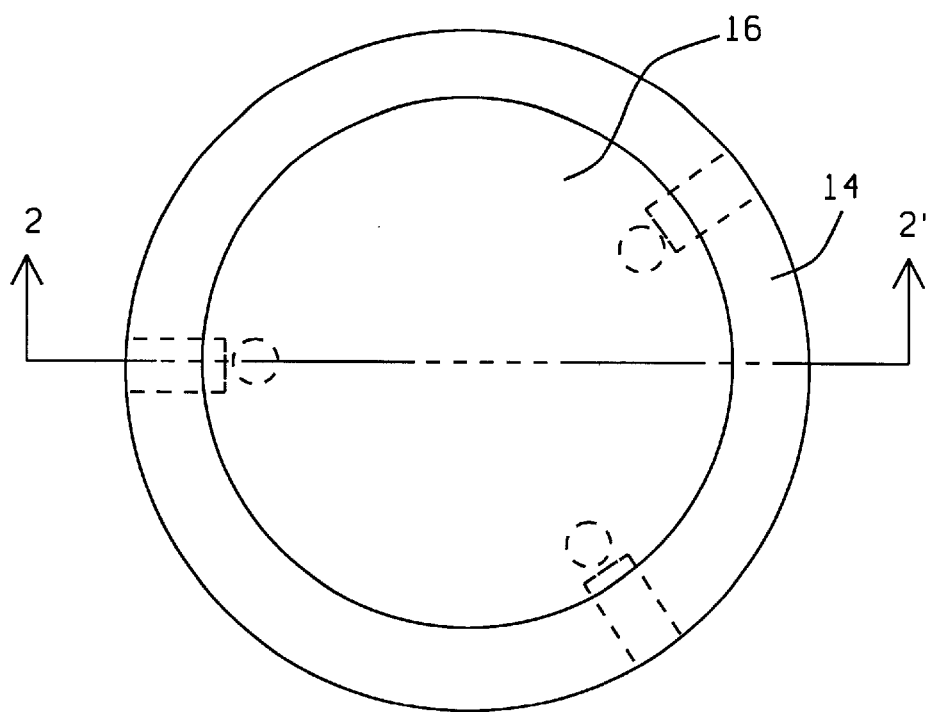
*FIG. 1 - Prior Art*
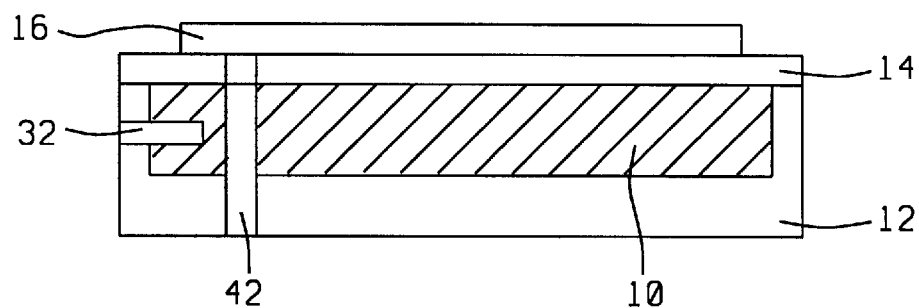
*FIG. 2 - Prior Art*

PEDESTAL DESIGN FOR A SPUTTER CLEAN CHAMBER TO IMPROVE ALUMINUM GAP FILLING ABILITY

BACKGROUND OF THE INVENTION (1) Field of the Invention

This invention relates to an apparatus and method for sputter cleaning and more specifically to an apparatus and method for sputter cleaning wherein the temperature of the pedestal on which a substrate to be cleaned is placed is controlled by flowing cooling liquid through the pedestal.

(2) Description of the Related Art

In a conventional sputter cleaning system a wafer, or other substrate, is placed on a layer of insulating material formed over a pedestal formed of conducting metal. FIG. 1 shows a top view and FIG. 2 a cross section view of a conventional wafer and pedestal arrangement. FIG. 2 shows a pedestal 10 having a layer of first insulating material 14 formed thereon. A layer of second insulating material 12 is formed on the sidewall and bottom of the pedestal 10. A wafer 16, or other substrate to be sputter cleaned, is placed on the layer of first insulating material 14. Silicon pins 32 extend through the second insulator 12 into the pedestal 14 to act as a radio frequency power antenna. Substrate extraction holes 42 provide for rods to be inserted to remove the substrate 16 after the cleaning has been completed. FIG. 1 shows the top view of the pedestal and wafer arrangement. The cross section view shown in FIG. 2 is taken along line 2–2' of FIG. 1.

The wafer 16, shown in FIGS. 1 and 2, is insulated from the metal pedestal 10 by the layer of first insulating material 14 and the pedestal 10 is insulated by the second insulator 12 so that during sputter cleaning of the wafer 16 the wafer temperature can become very high. This elevated wafer temperature has undesirable effects for later processing steps.

U.S. Pat. No. 6,077,353 to Al-Sharif et al. describes a pedestal insulator for a pre-clean chamber.

U.S. Pat. No. 6,033,482 to Parkhe describes a method for lighting a plasma in a plasma processing chamber, showing a plasma chamber with a pedestal.

U.S. Pat. No. 6,081,414 to Flanigan et al. describes apparatus for biasing and retaining a workpiece in a processing system. The apparatus includes a pedestal, a puck, and an electrode between the pedestal and the puck. The puck is an electrostatic chuck to hold the workpiece. The electrode can serve as a cooling plate for the puck.

U.S. Pat. No. 6,090,246 to Leiphart describes methods and apparatus for detecting neutral gas molecules reflected from a target during sputter deposition. Leiphart describes, but does not show, a cooling device, such as a water cooled backing plate to cool the target material during the sputtering process.

U.S. Pat. No. 6,077,404 to Wang et al. describes a method and apparatus for reflowing a material layer.

SUMMARY OF THE INVENTION

In a sputter cleaning system a pedestal 10, formed of conductive metal, forms a conductive surface below the wafer 16 so that the sputter cleaning can be accomplished, see FIG. 2. The wafer 16 is insulated from the conductive pedestal 10 by a layer of first insulating material 16, see FIG. 2. In this arrangement the temperature of the pedestal and wafer rise with continued cleaning because there is no path to remove the heat energy from the pedestal and wafer. This temperature rise can cause processing problems. Specifically in deposition of a layer of Ti/Al/TiN excessive temperature during cleaning will promote the formation of $TiAl_3$ which can result in void formation in the structure.

It is a principle objective of this invention to provide a method of sputter cleaning a substrate, such as a wafer, where the pedestal is cooled and the temperature of the pedestal is controlled.

It is another principle objective of this invention to provide an apparatus for cooling the pedestal and controlling the temperature of the pedestal during sputter cleaning of a substrate, such as a wafer.

These objective are achieved by forming a cooling channel in the metal pedestal. The cooling channel is made up of pipes for flowing cooling liquid, such as water. Any form of pipes can be used such as concentric, radial, or other appropriate shape for directing the cooling liquid. An inlet tube delivers a cooling liquid, such as water, to the cooling channel and an exhaust tube removes the cooling liquid from the cooling channel thereby removing heat from the pedestal.

BRIEF DESCRIPTION OF THE DRAWINGS

FIG. 1 shows a top view of a conventional substrate pedestal arrangement.

FIG. 2 shows a cross section view, taken along line 2–2' of FIG. 1, of a conventional substrate pedestal arrangement.

DESCRIPTION OF THE PREFERRED EMBODIMENTS

Figure 3:
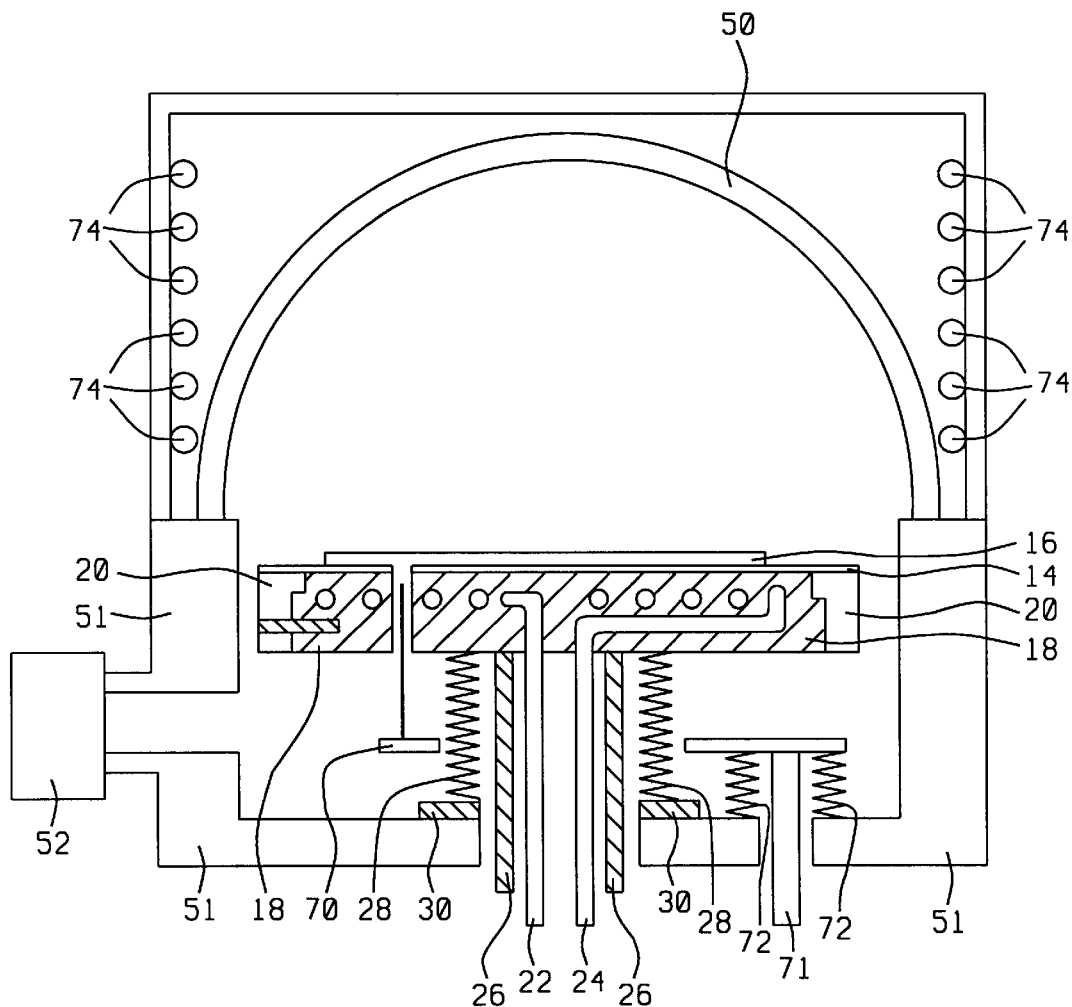
FIG. 3 shows a schematic view of a sputter cleaning system showing a pedestal of this invention.

Refer now to FIGS. 3–7 for a detailed description of the apparatus and method of this invention. FIG. 3 shows a schematic view of a sputter cleaning system. The sputter cleaning system has a quartz bell jar 50 on a base 51 surrounding the components of the sputter cleaning system so that the pressure at the sputter cleansing system can be controlled. A vacuum pump 52 is connected through the base 51 to provide means for regulating the pressure of the sputter cleaning system. The sputter cleaning system has coils 74 used for inducing a plasma in the sputter cleaning system.

The key part of the apparatus of this invention is a pedestal 18 on which the substrate 16 undergoing sputter cleaning is placed. The pedestal 18 is formed of a conductive metal, such as stainless steel, an aluminum alloy, or titanium, and forms a conductive surface beneath a substrate to facilitate the sputter cleaning process. A layer of first insulating material 14, such as quartz, is formed on the top surface of the pedestal 18. A layer of second insulating material 20, such as quartz, is formed on the sidewall of the pedestal 18 forming an insulating collar. A support mechanism 26, in this case metal rods, is attached to the bottom surface of the pedestal 18 and pass through the base 51. The support mechanism 26 can move the pedestal 18 in the vertical direction. Push rods 70 pass through holes in the pedestal 18 to lift the substrate 16 from the pedestal 18.

An inlet tube 22 and an exhaust tube 24 also pass through the base 51. A first bellows 28 is attached on one end to the bottom surface of the pedestal 18 and at the other end to a flange 30 attached to the base 51. The first bellows 28 and the flange 30 provide a vacuum seal around the region where the support mechanism 26, inlet tube 22, and exhaust tube 24 pass through the base 51. The first bellows 28 and flange 30 also allow the support mechanism 26 to move the pedestal 18 in the vertical direction while maintaining a vacuum seal. The push rods 70 are attached to a push rod activator 71 which passes through the base 51. A second bellows 72 maintains a vacuum seal around the region where the push rod activator 71 passes through the base 51 and allows the push rod activator 71 and push rods 70 to move in the vertical direction.

Figure 4:
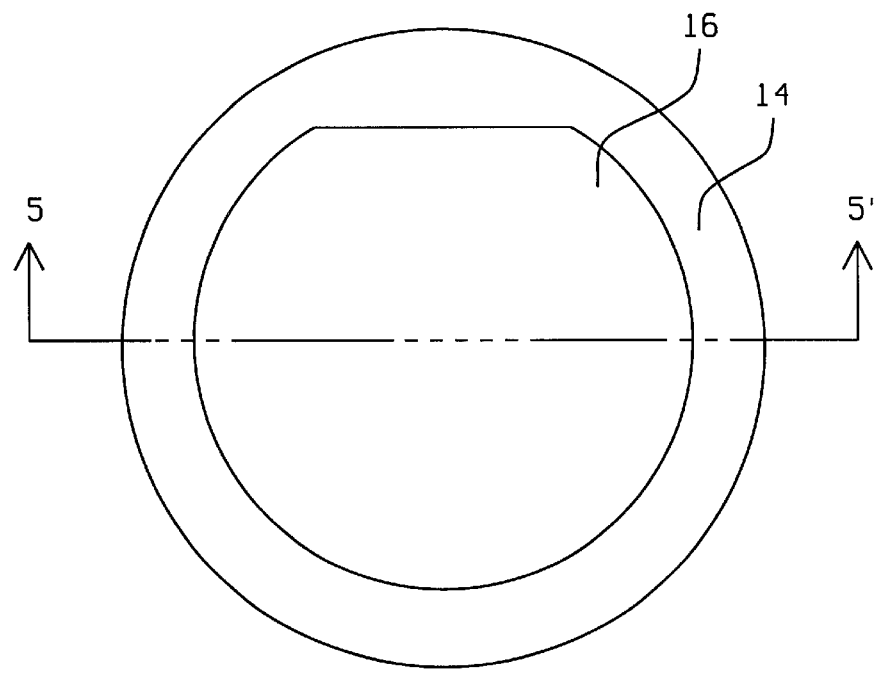
FIG. 4 shows a top view of the substrate pedestal arrangement for the pedestal of this invention.
Figure 5:
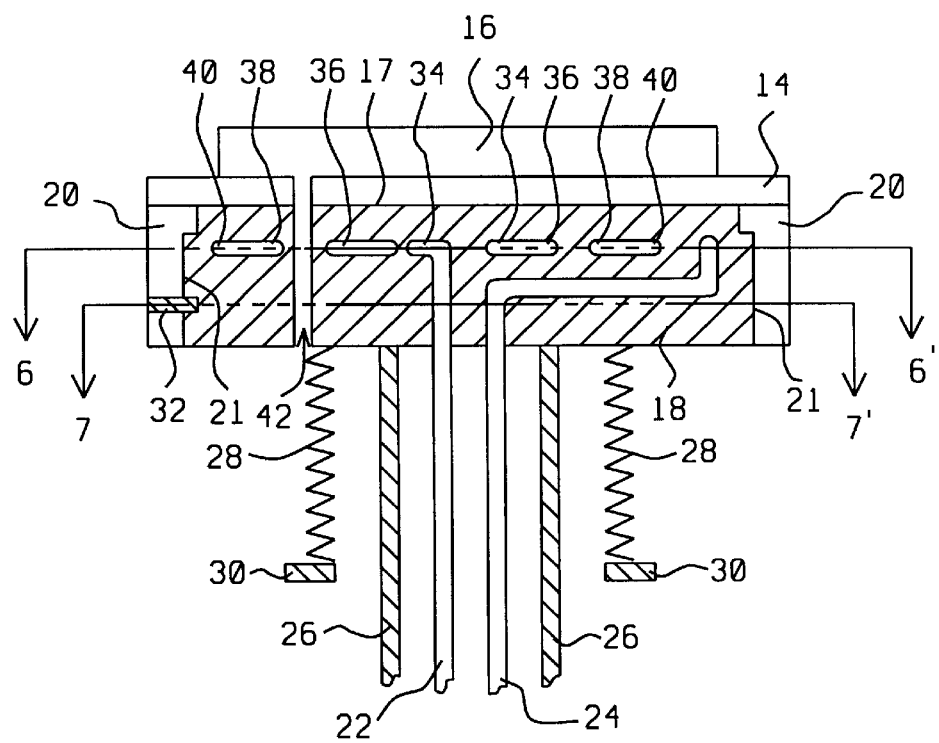
FIG. 5 shows a cross section view, taken along line 5–5' of FIG. 4 of the substrate pedestal arrangement of this invention.

The pedestal 18 will now be described in more detail with reference to FIGS. 4–7. FIG. 4 shows a top view of the pedestal with a substrate 16, such as an integrated circuit wafer, placed on the layer of first insulating material 14. FIG. 5 shows a cross section view of the pedestal 18 taken along line 5–5' of FIG. 4. FIG. 5 shows the layer of first insulating material 14, for example quartz, formed on the top surface 17 of the pedestal. A layer of second insulating material 20, for example quartz, is formed on the sidewall 21 of the pedestal 18 to form an insulating collar around the sidewall 21 of the pedestal 18. The flange 30, bellows 28, and support mechanism 26 are as explained previously with reference to FIG. 3.

The key part of the pedestal is a cooling channel, shown by reference numbers 34, 36, 38, and 40 formed in the interior of the pedestal 18 through which cooling liquid, for example cooling water, flows. The cooling channel is connected to one end of the inlet tube 22 and one end of the exhaust tube 24. The inlet tube 22 and the exhaust tube 24 pass through the bottom surface 19 of the pedestal 18 to connect to the cooling channel in a manner which will be explained in greater detail later. A number of substrate extraction holes in the pedestal 42, one of which is shown in FIG. 5, provide for rods to be inserted to remove the substrate 16 after the cleaning has been completed. A number of silicon pins 32, one of which is shown in FIG. 5, extend through the insulating collar 20, through the sidewall 21 of the pedestal 18, and into the pedestal 18 to act as a radio frequency power antenna.

Figure 6:
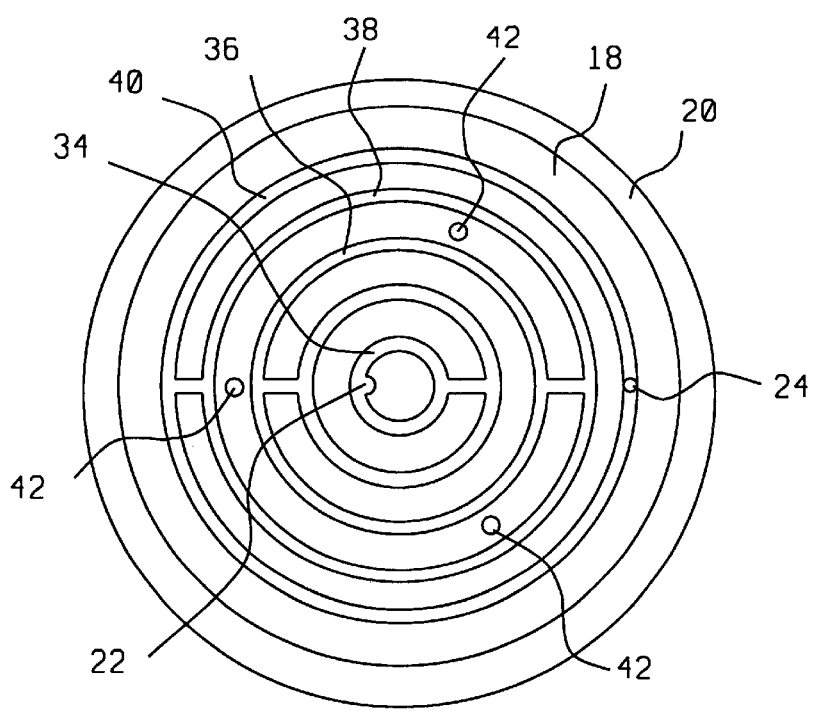
FIG. 6 shows a horizontal section view of the substrate pedestal arrangement for the pedestal of this invention taken along line 6–6' of FIG. 5.

The detail of the cooling channel is shown in greater detail in FIG. 6. FIG. 6 is a horizontal section view of the pedestal 18 taken along line 6–6' of FIG. 5. FIG. 6 shows the pedestal 18, insulating collar 20, and three substrate extraction holes 42. The cooling channel is made up of a number, for example four, of concentric interconnected sub-channels, 34, 36, 38, and 40. The innermost sub-channel 34 is connected to one end of the inlet tube 22. The outermost sub-channel 40 is connected to one end of the exhaust tube 24. Cooling liquid flows through the inlet tube 22 into the innermost sub-channel 34, to the second sub-channel 36, to the third sub-channel 38, to the outermost sub-channel 40, and into the exhaust tube 24.

The exhaust tube 24 removes the cooling liquid, and the heat the cooling liquid has removed from the pedestal 18, away from the pedestal 18 and out of the sputter cleaning system through the base 51, see FIG. 3. In this way the heat produced in the pedestal 18 by the sputter cleaning process is removed from the pedestal 18 and the temperature of the pedestal can be controlled.

The example shown in FIG. 6 shows a cooling channel made up of concentric interconnected sub-channels. Those skilled in the art will readily recognize that other cooling channel shapes can be used, such as a radial shape or other appropriate shape that can deliver cooling liquid throughout the pedestal so that heat can be removed from the pedestal. As in the case of concentric interconnected sub-channels, the inlet tube 22 delivers the cooling liquid to the cooling channel and the exhaust tube 24 removes the cooling liquid, and the heat the cooling liquid has removed from the pedestal 18, from the cooling channel.

Figure 7:
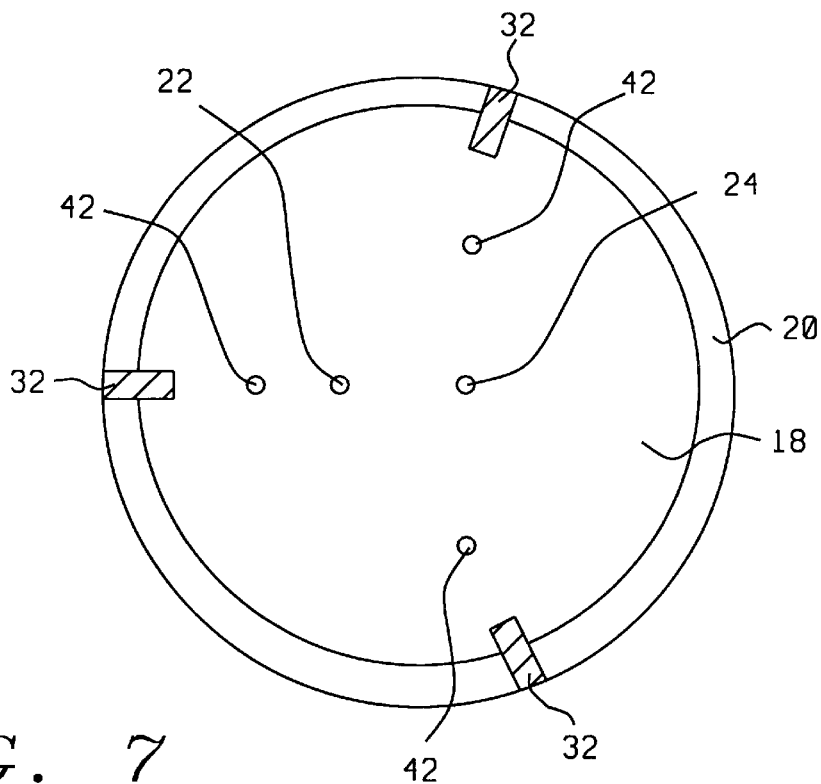
FIG. 7 shows a horizontal section view of the substrate pedestal arrangement for the pedestal of this invention taken along line 7–7' of FIG. 5.

FIG. 7 shows a horizontal section view of the pedestal taken along line 7–7' of FIG. 5. FIG. 7 shows three silicon pins 32 each acting as a radio frequency power antenna. FIG. 7 shows three substrate extraction holes 42. FIG. 7 also shows the inlet tube 22 and the exhaust tube 24.

During sputter cleaning a substrate, such as sputter cleaning an integrated circuit wafer, the substrate is placed on the pedestal. Cooling liquid, for example cooling water, then flows through the cooling channel in the pedestal 18 to remove heat from the pedestal and maintain temperature control of the pedestal. This also maintains temperature control of the substrate being sputter processed. The cooling channel being formed within the pedestal itself provides for much improved temperature control. The pedestal provides a conducting surface under the substrate for the sputter cleaning process.

While the invention has been particularly shown and described with reference to the preferred embodiments thereof, it will be understood by those skilled in the art that various changes in form and details may be made without departing from the spirit and scope of the invention.

What is claimed is:

1. A method of sputter cleaning, comprising:

providing a pedestal formed of conducting metal having a top surface, a bottom surface, and a sidewall;

providing a vacuum chamber having an exterior shell, wherein said pedestal is contained within said exterior shell;

providing a layer of first insulating material formed on said top surface of said pedestal;

providing a layer of second insulating material formed on said sidewall of said pedestal thereby forming an insulating collar on said sidewall of said pedestal;

providing a cooling channel having an inlet end and an exhaust end formed in said pedestal;

providing an inlet tube wherein one end of said inlet tube is connected to said inlet end of said cooling channel and said inlet tube passes through said exterior shell of said vacuum chamber;

providing an exhaust tube wherein one end of said exhaust tube is connected to said exhaust end of said cooling channel and said exhaust tube passes through said exterior shell of said vacuum chamber;

providing a support mechanism attached to said bottom surface of said pedestal, wherein said support mechanism passes through said exterior shell of said vacuum chamber;

providing means to maintain a vacuum seal at the region where said inlet tube, said outlet tube, and said support mechanism pass through said exterior shell of said vacuum chamber;

placing a substrate on said layer of first insulating material; and sputter cleaning said substrate while flowing cooling liquid through said cooling channel thereby controlling the temperature of said pedestal during said sputter cleaning.

2. The method of claim 1, wherein said first insulating material is quartz.

3. The method of claim 1, wherein said second insulating material is quartz.

4. The method of claim 1, wherein said cooling liquid is water.

5. The method of claim 1, wherein said cooling channel comprises a number of interconnected concentric sub-channels.

6. The method of claim 1, further comprising a number of conductive pins extending through said insulating collar, through said sidewall of said pedestal, and into said pedestal wherein said conducting pins serve as a radio frequency power antenna.

7. The method of claim 1 wherein a cooling liquid source is connected to said inlet tube outside of said vacuum chamber.

8. The method of claim 1 wherein a cooling liquid exhaust is connected to said exhaust tube outside of said vacuum chamber.

9. The method of claim 1 wherein said support mechanism comprises metal rods attached to said bottom surface of said pedestal whereby said pedestal can be raised or lowered.

10. The method of claim 1 wherein said means to maintain a vacuum seal comprises a flange and a bellows attached to provide a vacuum seal between said bottom surface of said pedestal and said exterior shell of said vacuum chamber.

11. A sputter cleaning system, comprising:

a pedestal formed of conducting metal having a top surface, a bottom surface, and a sidewall;

a vacuum chamber having an exterior shell, wherein said pedestal is contained within said exterior shell;

a layer of first insulating material formed on said top surface of said pedestal;

a layer of second insulating material formed on said sidewall of said pedestal thereby forming an insulating collar on said sidewall of said pedestal;

a cooling channel having an inlet end and an exhaust end formed in said pedestal, whereby the temperature of said pedestal can be controlled by flowing cooling liquid through said cooling channel;

an inlet tube wherein one end of said inlet tube is connected to said inlet end of said cooling channel and said inlet tube passes through said exterior shell of said vacuum chamber;

an exhaust tube wherein one end of said exhaust tube is connected to said exhaust end of said cooling channel and said exhaust tube passes through said exterior shell of said vacuum chamber;

a support mechanism attached to said bottom surface of said pedestal, wherein said support mechanism passes through said exterior shell of said vacuum chamber; and means to maintain a vacuum seal at the region where said inlet tube, said outlet tube, and said support mechanism pass through said exterior shell of said vacuum chamber.

12. The sputter cleaning system of claim 11, wherein said first insulating material is quartz.

13. The sputter cleaning system of claim 11, wherein said second insulating material is quartz.

14. The sputter cleaning system of claim 11, wherein said cooling liquid is water.

15. The sputter cleaning system of claim 11, wherein said cooling channel comprises a number of interconnected concentric sub-channels.

16. The sputter cleaning system of claim 11, further comprising a number of conductive pins extending through said insulating collar, through said sidewall of said pedestal, and into said pedestal wherein said conductive pins serve as a radio frequency power antenna.

17. The sputter cleaning system of claim 11 wherein an integrated circuit wafer is placed on said layer of first insulating material.

18. The sputter cleaning system of claim 11 wherein a cooling liquid source is connected to said inlet tube outside of said vacuum chamber.

19. The sputter cleaning system of claim 11 wherein a cooling liquid exhaust is connected to said exhaust tube outside of said vacuum chamber.

20. The sputter cleaning system of claim 11 wherein said support mechanism comprises metal rods attached to said bottom surface of said pedestal whereby said pedestal can be raised or lowered.

21. The sputter cleaning system of claim 11 wherein said means to maintain a vacuum seal comprises a flange and a bellows attached to provide a vacuum seal between said bottom surface of said pedestal and said exterior shell of said vacuum chamber.

* * * * *